(12) United States Patent
Yamamoto

(10) Patent No.: US 7,298,426 B2
(45) Date of Patent: Nov. 20, 2007

(54) TELEVISION TUNER HAVING VARIABLE GAIN REDUCTION

(75) Inventor: Masaki Yamamoto, Fukushima (JP)

(73) Assignee: Alps Electric Co., Ltd., Tokyo (JP)

( * ) Notice: Subject to any disclaimer, the term of this patent is extended or adjusted under 35 U.S.C. 154(b) by 548 days.

(21) Appl. No.: 11/040,126

(22) Filed: Jan. 21, 2005

(65) Prior Publication Data

US 2005/0162567 A1   Jul. 28, 2005

(30) Foreign Application Priority Data

Jan. 26, 2004   (JP) ............... 2004-000264

(51) Int. Cl.
 *H04N 5/50* (2006.01)
 *H04L 27/08* (2006.01)
 *H04B 1/16* (2006.01)
(52) U.S. Cl. .................. 348/731; 375/345; 455/334
(58) Field of Classification Search ........... 348/725, 348/731; 455/180.2, 188.2, 232.1, 334; 375/345; 330/277; 334/47, 52
See application file for complete search history.

(56) References Cited

U.S. PATENT DOCUMENTS 6,566,953 B2   5/2003   Yamamoto

FOREIGN PATENT DOCUMENTS

| JP | 2001-320647 A | 11/2001 |
| JP | 2002-368639 A | 12/2002 |

*Primary Examiner*—Brian P. Yenke
(74) *Attorney, Agent, or Firm*—Joseph A. Calvaruso; Chadbourne & Parke LLP

(57) ABSTRACT

An integrated circuit comprises a switching transistor having an emitter connected to a grounding terminal, a first resistor connected between a first gate of a first field-effect transistor and the grounding terminal, a second resistor connected between the first gate of the field-effect transistor and a collector of the switching transistor, and a third resistor connected between the collector of the switching transistor and a drain of the field-effect transistor. The integrated circuit further comprises a bias voltage terminal connected to the collector of the switching transistor to apply a voltage to the bias voltage terminal from the outside of the integrated circuit via a sixth resistor.

4 Claims, 1 Drawing Sheet

TELEVISION TUNER HAVING VARIABLE GAIN REDUCTION

BACKGROUND OF THE INVENTION

1. Field of the Invention

The present invention relates to a television tuner capable of receiving a UHF-band television signal and a VHF-band television signal.

2. Description of the Related Art

The structure of a known television tuner is illustrated in FIG. 2. A VHF- or UHF-band television signal is input to an input terminal 1. A VHF input tuning circuit 3 capable of switching bands is connected to the input terminal 1 via a filter 2. A UHF input tuning circuit 5 is connected to the filter 2 via a switching diode 4. A voltage from the VHF input tuning circuit 3 is applied to the anode of the switching diode 4. The output terminal of the VHF input tuning circuit 3 and the output terminal of the UHF input tuning circuit 5 are connected to an integrated circuit 20. First and second dual-gate field-effect transistors (FETs) 21 and 22, a third single gate FET 23, and a plurality of resistors are disposed inside the integrated circuit 20, wherein the resistors mutually connect the first, second, and third FETs 21, 22, and 23.

Inside the integrated circuit 20, a first gate G1 of the first FET 21 and a drain D of the third FET 23 are connected by a first resistor 24, a second gate G2 of the first FET 21 and a second gate G2 of the second FET 22 are connected by a second resistor 25, a source S of the first FET 21 and a source S of the second FET 22 are connected by third resistor 26, and a gate G of the third FET 23 and the first gate G1 of the second FET 22 are connected by a fourth resistor 27.

The integrated circuit 20 includes a first external terminal 20a connected to the first gate G1 of the first FET 21, a second external terminal 20b connected to the second gate G2 of the first FET 21, a third external terminal 20c connected to the drain D of the third FET 23, a fourth external terminal 20d connected to the first gate G1 of the second FET 22, a fifth external terminal 20e connected to the source S of the second FET 22, a sixth external terminal 20f connected to a drain D of the second FET 22, a seventh external terminal 20g connected to the source S of the first FET 21, and an eighth external terminal 20h connected to a drain D of the first FET 21.

The VHF input tuning circuit 3 is connected to the first external terminal 20a, and the UHF input tuning circuit 5 is connected to the fourth external terminal 20d. The second external terminal 20b is connected to an automatic gain control (AGC) terminal 8. An AGC voltage is applied to the AGC terminal 8.

One end of a peaking coil 9 is connected to the fourth external terminal 20d. The other end is connected to a direct current (DC) cutting capacitor 10 for high-frequency grounding and is also connected to a switching terminal 11. The level of the switching voltage applied to the switching terminal 11 increases when the switching terminal 11 receives a UHF-band television signal and decreases when the switching terminal 11 receives a VHF-band television signal.

The third external terminal 20c is connected to the cathode of the switching diode 4 via a resistor 12 and is connected to a power terminal 14 via a pull-up resistor 13.

The eighth external terminal 20h is connected to a VHF inter-stage tuning circuit (not shown in the drawing). A power-supply voltage is applied to the VHF inter-stage tuning circuit and is further applied to the first FET 21 via the eighth external terminal 20h. The seventh external terminal 20g is directly grounded.

The sixth external terminal 20f is connected to a UHF inter-stage tuning circuit (not shown in the drawing). A power-supply voltage is applied to the UHF inter-stage tuning circuit and is further applied to the drain D of the second FET 22 via the sixth external terminal 20f. The fifth external terminal 20e is grounded by a capacitor 15.

According to the above-described structure, when the television tuner receives a UHF-band television signal, a predetermined bias voltage required for operation is applied to the first gate G1 of the second FET 22 by applying a high-level switching voltage to the switching terminal 11. In this way, the television tuner enters an operational state. Simultaneously, the third FET 23 turns on, causing the switching diode 4 to turn on. Consequently, the television signal can be input to the UHF input tuning circuit 5. The television signal selected by the UHF input tuning circuit 5 is input to the first gate G1 of the second FET 22.

When the third FET 23 turns on, the voltage at the first gate G1 of the first FET 21 becomes a bias voltage, and, thus, the television tuner enters a not-ready state.

When the television tuner receives a VHF-band television signal, a low level switching voltage is applied to the switching terminal 11. Accordingly, the bias voltage at the first gate G1 of the second FET 22 becomes zero, and the second FET 22 enters a not-ready state. Moreover, since the third FET 23 turns off, the switching diode 4 also turns off. Thus, a television signal is not input to the UHF input tuning circuit 5. Since the third FET 23 is turned off, a predetermined bias voltage required for operation is applied to the first gate G1 of the first FET 21, enabling the operation of the first FET 21. Although not shown in the drawing, a resistor for adjusting the bias voltage to a correct value is connected between the first gate G1 of the first FET 21 and the source S of the first FET 21. A VHF-band television signal selected by the VHF input tuning circuit 3 is input to the first gate G1 of the first FET 21 and is amplified (for example, refer to Japanese Unexamined Patent Application Publication No. 2002-368639).

According to the above-described known structure of a television tuner, the bias voltages applied to the first gate G1 of the first FET 21 and the first gate G1 of the second FET 22 are determined by the resistors disposed inside the integrated circuit 20. Therefore, the values of the voltages are predetermined and the gain reduction versus AGC voltage characteristics (i.e., AGC curve) cannot be changed.

SUMMARY OF THE INVENTION

An object of the present invention is to provide a television tuner in which the gain reduction versus AGC voltage characteristics (i.e., AGC curve) can be easily changed from the outside of the integrated circuit.

To achieve the above-mentioned object, the present invention provides a television tuner comprising: a first field-effect transistor for amplifying a television signal of a first frequency, the first field-effect transistor being disposed inside the television tuner; a second field-effect transistor for amplifying a television signal of a second frequency, the second field-effect transistor being disposed inside the television tuner; and an integrated circuit. The integrated circuit comprises a grounding terminal connected to the sources of the first and second field-effect transistors; a first input terminal for inputting the television signal of a first frequency, the first input terminal being connected to a first gate of the first field-effect transistor; a second input terminal for inputting the television signal of a second frequency, the second input terminal being connected to a first gate of the second field-effect transistor; a switching transistor having an emitter connected to the grounding terminal; a first resistor connected between the first gate of the first field-effect transistor and the switching transistor; a second resistor connected between the first gate of first field-effect transistor and a collector of the switching transistor; a third resistor connected between the collector of the switching transistor and a drain of the second field-effect transistor; and a fourth resistor connected between a base of the switching transistor and the first gate of the second field-effect transistor. A power-supply voltage is applied to drains of the first and second field-effect transistors. An automatic gain control voltage is applied to second gates of the first and second field-effect transistors. A bias voltage is applied to the second input terminal via a fifth resistor from outside of the integrated circuit when the television signal of a second frequency is received. A voltage is applied to a bias voltage terminal from outside the integrated circuit via a sixth resistor, the bias voltage terminal being connected to the collector of the switching transistor.

The above-mentioned bias voltage terminal is grounded via the sixth resistor.

A power-supply voltage is applied to the above-mentioned bias voltage terminal via the sixth resistor.

A seventh resistor is interposed between the above-mentioned bias voltage terminal and the connecting point of the collector of the switching transistor, the second resistor, and the third resistor.

According to a first aspect of the present invention, a bias voltage is applied to the second input terminal via a fifth resistor from outside of the integrated circuit when the television signal of a second frequency is received, and a voltage is applied to a bias voltage terminal from outside the integrated circuit via a sixth resistor, the bias voltage terminal being connected to the collector of the switching transistor. Therefore, the bias voltages of the first gates of the first and second FETs can be set to any value. Consequently, the gain reduction characteristic of each FET can be changed by resistors outside the integrated circuit.

According to the second aspect of the present invention, a bias voltage terminal is grounded via the sixth resistor. Therefore, the bias voltage of the first gate of the first FET can be reduced.

According to the third aspect of the present invention, a power-supply voltage is applied to the bias voltage terminal via the sixth resistor. Therefore, the bias voltage of the first gate of the first FET can be increased.

According to the fourth aspect of the present invention, a seventh resistor is interposed between the bias voltage terminal and the connecting point of the collector of the switching transistor, the second resistor, and the third resistor. Therefore, the switching transistor can be protected.

DESCRIPTION OF THE PREFERRED EMBODIMENTS

Figure 1:
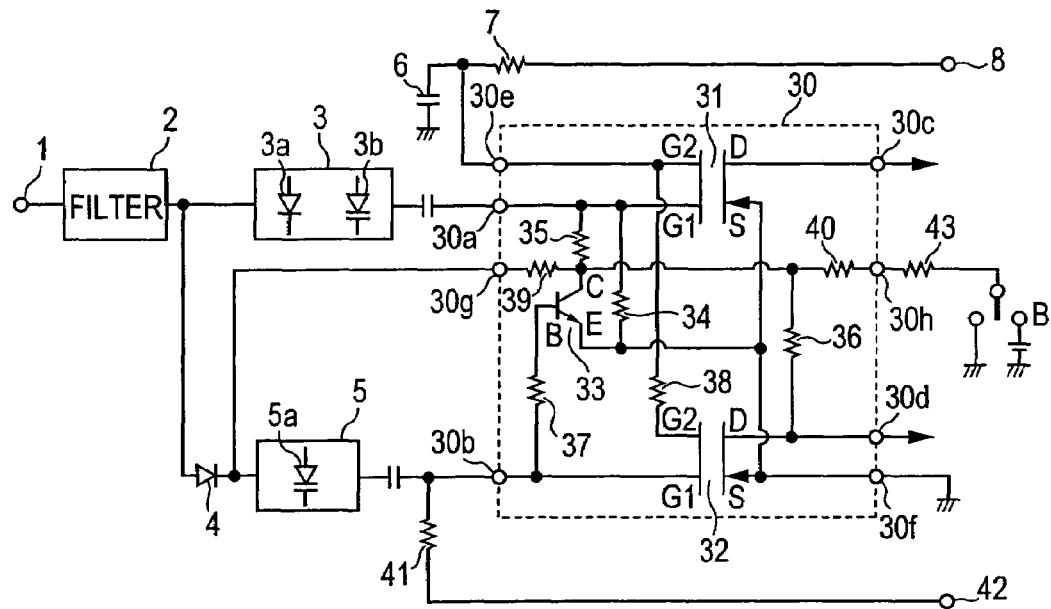
FIG. 1 is a circuit diagram illustrating the structure of a television tuner according to the present invention.
Figure 2:
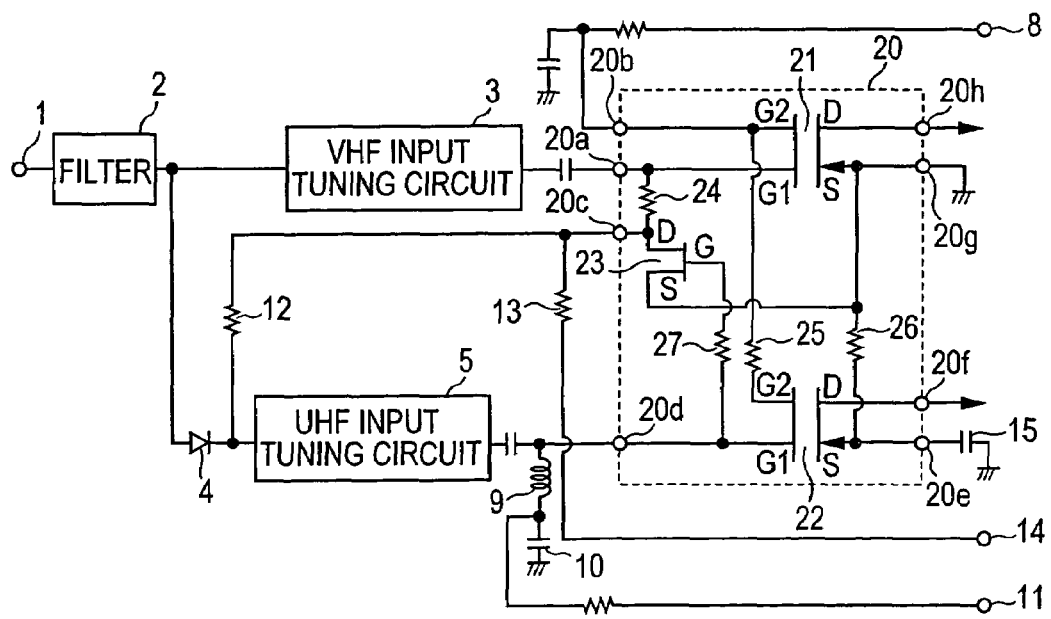
FIG. 2 is a circuit diagram illustrating the structure of a known television tuner.

The structure of the television tuner according to the present invention is illustrated in FIG. 1. In FIG. 1, the components that are the same as those in FIG. 2, illustrating the structure of a known television tuner, are indicated by the same reference numerals. A VHF- or UHF-band television signal is input to an input terminal 1. A VHF input tuning circuit 3 is connected to the input terminal 1 via a filter 2 for removing unwanted signals. The VHF input tuning circuit 3 is a band-switching tuning circuit. A voltage is applied to the anodes of a switching diode 3a and a varactor diode 3b disposed inside the VHF input tuning circuit 3. The VHF input tuning circuit 3 is switched to tune in the high or low frequency band of the VHF-band in accordance with the on and off state of the switching diode 3a. The tuning frequency changes due to the varactor diode 3b. The circuit for switching the VHF input tuning circuit 3 and the switching diode 3a between on and off states is omitted.

The filter 2 is connected to a UHF input tuning circuit 5 via a switching diode 4. The VHF input tuning circuit 3 applies a voltage to the anode of the switching diode 4. A varactor diode 5a for changing the tuning frequency is disposed inside the UHF input tuning circuit 5. Output terminals of the VHF input tuning circuit 3 and the UHF input tuning circuit 5 are connected to an integrated circuit 30. The integrated circuit 30 includes first and second dual gate FETs 31 and 32, a switching transistor 33, and a plurality of resistors for mutually connecting the first and second FETs 31 and 32 and the switching transistor 33.

Inside the integrated circuit 30, sources S of the first and second FETs 31 and 32 are mutually connected. A first resistor 34 is connected between the sources S of the first and second FETs 31 and 32 and a first gate G1 of the first FET 31, a second resistor 35 is connected between the first gate G1 of the first FET 31 and a collector C of the switching transistor 33, and a third resistor 36 is connected between the collector C of the switching transistor 33 and a drain D of the second FET 32. The third resistor 36 may instead be connected between the collector C of the switching transistor 33 and the drain D of the first FET 31. A fourth resistor 37 is connected between a base B of the switching transistor 33 and the first gate G1 of the second FET 32, and a resistor 38 is connected between a second gate G2 of the first FET 31 and the a second gate G2 of the second FET 32.

The integrated circuit 30 includes a first input terminal 30a connected to the first gate G1 of the first FET 31, a second input terminal 30b connected to the first gate G1 of the second FET 32, a first output terminal 30c connected to the drain D of the first FET 31, a second output terminal 30d connected to the drain D of the second FET 32, an AGC voltage terminal 30e connected to the second gate G2 of the first FET 31, and a grounding terminal 30f connected to the sources S of the first and second FETs 31 and 32. Furthermore, the integrated circuit 30 includes a switching terminal 30g and a bias voltage terminal 30h. A resistor 39 is connected between the switching terminal 30g and a connecting point of the collector C of the switching transistor 33, the second resistor 35, and the third resistor 36. A resistor 40 is connected between the connecting point and the bias voltage terminal 30h.

The output terminal of the VHF input tuning circuit 3 is connected to the first input terminal 30a, and the output terminal of the UHF input tuning circuit 5 is connected to the second input terminal 30b. Accordingly, a first television signal having a VHF-band frequency is input to the first gate G1 of the first FET 31, and a second television signal having a UHF-band frequency is input to the first gate G1 of the second FET 32. The AGC voltage terminal 30e is connected to a direct current-cutting capacitor 6 for high-frequency grounding and is connected to an AGC terminal 8 via a resistor 7. An AGC voltage is applied to the AGC terminal 8. In this way, the AGC voltage is applied to the second gates G2 of the first and second FETs 31 and 32.

A switching voltage is applied to the second input terminal 30b from a fifth resistor 41 disposed outside the integrated circuit 30 via a U/V switching terminal 42. The level of this switching voltage increases when the television tuner receives a UHF-band television signal and decreases when the television tuner receives a VHF-band television signal.

The switching terminal 30g of the integrated circuit 30 is connected to the cathode of the switching diode 4. A sixth resistor 43 is connected to, for example, a power source B or is grounded so as to apply a predetermined voltage to the bias voltage terminal 30h via the sixth resistor 43.

A VHF inter-stage tuning circuit (not shown in the drawing) is connected to the first output terminal 30c. A power-supply voltage is applied to the VHF inter-stage tuning circuit and is further applied to the drain D of the first FET 31 via the first output terminal 30c. The grounding terminal 30f is directly grounded.

A UHF inter-stage tuning circuit (not shown in the drawing) is connected to the second output terminal 30d. A power-supply voltage is applied to the UHF inter-stage tuning circuit and is further applied to the drain D of the second FET 32 via the second output terminal 30d.

According to the above-described structure, the bias voltage applied to the first gate G1 of the first FET 31 is basically determined by the resistance of the first resistor 34, the second resistor 35, and the third resistor 36. The value of the bias voltage, however, may be increased or decreased depending on whether the sixth resistor 43 is connected to the power source B or is grounded, and also depending on the resistance of the resistors. As a result, the change pattern in gain of the AGC voltage applied to the second gate G2 of the first FET 31 (i.e., the AGC voltage when gain reduction begins) and the change pattern in gain reduction after the gain reduction begins can be changed. In this case, the seventh resistor 40 is not required. If the seventh resistor 40 is not included in television tuner, the switching terminal 30g and the connecting point of the collector C of the switching transistor 33, the second resistor 35, and the third resistor 36 may be directly connected to each other. However, it is recommended to include the seventh resistor 40 since it effectively protects the switching transistor 33 and the first FET 31.

According to the above-described structure, when a UHF-band television signal is received, a high-level switching voltage is applied to the U/V switching terminal 42. Accordingly, the switching transistor 33 turns on, causing a predetermined bias voltage that is divided at the fourth and fifth resistors 37 and 41 and that is required for operation to be applied to the first gate G1 of the second FET 32. As a result, the second FET 32 enters an operational state. Since the switching diode 4 simultaneously turns on, the television signal can be input to the UHF input tuning circuit 5. The television signal selected by the UHF input tuning circuit 5 is input to the first gate G1 of the second FET 32. Since, at this time, the fourth resistor 37 is connected between the first gate G1 of the second FET 32 and the base B of the switching transistor 33, the input UHF-band television signal does not undergo gain reduction.

When the switching transistor 33 is turned on, the bias voltage at the first gate G1 of the first FET 31 becomes zero, and the first FET 31 enters a not-ready state.

An AGC voltage is applied to the second gate G2 of the second FET 32 via the resistor 38. Accordingly, parasitic oscillation is suppressed by negative feedback, and distortion is suppressed when the AGC voltage is reduced so that the gain is reduced by about 35 dB. Furthermore, by changing the resistance of the fifth resistor 41 disposed outside the integrated circuit 30, the bias voltage of the first gate G1 of the second FET 32 can be changed. Consequently, the change pattern of the gain of the second FET 32 due to the AGC voltage or, in other words, the gain reduction characteristics, can be changed.

When a VHF-band television signal is received, a low-level switching voltage is applied to the U/V switching terminal 42. Accordingly, the bias voltage at the first gate G1 of the second FET 32 becomes zero, and the second FET 31 enters a not-ready state. Since the switching transistor 33 turns off, the switching diode 4 also turns off. Consequently, a television signal is not input to the UHF input tuning circuit 5. Furthermore, since the switching transistor 33 is turned off, a predetermined bias voltage required for operation is applied to the first gate G1 of the first FET 31, and the first FET 31 enters an operational state.

The VHF-band television signal selected by the VHF input tuning circuit 3 is input to the first gate G1 of the first FET 31 and is amplified. In this case, since the collector C of the switching transistor 33 and the first gate G1 of the first FET 31 are connected by the second resistor 35, the output capacitance component of the switching transistor 33 is not directly sent to the first gate G1 of the FET 31. Thus, the output capacitance component is not added to the VHF input tuning circuit 3, and the range of change in the tuning frequency of the VHF input tuning circuit 3 is not reduced.

According to the above-described television tuner, the switching transistor 33 is a bipolar transistor. The switching transistor 33, however, may be a field-effect transistor (FET). If an FET is used, the collector, source, and base in the description above should be changed to a drain, emitter, and gate, respectively.

The invention claimed is:

1. A television tuner comprising:
   a first field-effect transistor for amplifying a television signal of a first frequency, the first field-effect transistor being disposed inside the television tuner;
   a second field-effect transistor for amplifying a television signal of a second frequency, the second field-effect transistor being disposed inside the television tuner; and
   an integrated circuit, the integrated circuit including a grounding terminal coupled to the sources of the first and second field-effect transistors; a first input terminal for inputting the television signal of a first frequency, the first input terminal being coupled to a first gate of the first field-effect transistor; and a second input terminal for inputting the television signal of a second frequency, the second input terminal being coupled to a first gate of the second field-effect transistor;
   wherein a switching transistor having an emitter coupled to the grounding terminal, a first resistor disposed between the first gate of the first field-effect transistor and the grounding terminal, a second resistor disposed between the first gate of the first field-effect transistor and a collector of the switching transistor, a third resistor disposed between the collector of the switching transistor and a drain of the first or second field-effect transistor, and a fourth resistor disposed between a base of the switching transistor and the first gate of the second field-effect transistor are disposed inside the integrated circuit,
   wherein a power-supply voltage is appliable to the drains of the first and second field-effect transistors, wherein an automatic gain control voltage is appliable to second gates of the first and second field-effect transistors, wherein a bias voltage is appliable to the second input terminal via a fifth resistor from outside of the integrated circuit when the television signal of a second frequency is received, and wherein a voltage is appliable to a bias voltage terminal from outside the integrated circuit via a sixth resistor, the bias voltage terminal being coupled to the collector of the switching transistor.

2. The television tuner according to claim 1, wherein the bias voltage terminal is grounded via the sixth resistor.

3. The television tuner according to claim 1, wherein a power-supply voltage is appliable to the bias voltage terminal via the sixth resistor.

4. The television tuner according to claim 1, wherein a seventh resistor is interposed between a bias voltage terminal and the connecting point of the collector of the switching transistor, the second resistor, and the third resistor.

* * * * *